United States Patent
Casserly et al.

(10) Patent No.: US 9,861,020 B2
(45) Date of Patent: Jan. 2, 2018

(54) MULTIPLE EXPANSION CARD INSERTION AND EXTRACTION TOOL

(71) Applicant: International Business Machines Corporation, Armonk, NY (US)

(72) Inventors: Karl O. Casserly, Valley Stream, NY (US); Leung M. Hung, Poughkeepsie, NY (US); Mark L. Monroe, Poughkeepsie, NY (US); Ronny R. Shipley, Pleasant Valley, NY (US); Tracy A. Tong, Hopewell Junction, NY (US); James Verzi, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 14/878,827

(22) Filed: Oct. 8, 2015

(65) Prior Publication Data

US 2016/0029522 A1    Jan. 28, 2016

Related U.S. Application Data

(63) Continuation of application No. 13/657,952, filed on Oct. 23, 2012, now Pat. No. 9,635,795.

(51) Int. Cl.
*H02G 11/00* (2006.01)
*H05K 13/04* (2006.01)
*G06F 1/18* (2006.01)

(52) U.S. Cl.
CPC ......... *H05K 13/0486* (2013.01); *G06F 1/185* (2013.01); *H05K 2203/176* (2013.01); *Y10T 29/49817* (2015.01)

(58) Field of Classification Search
CPC ......... B23P 11/00; B23P 11/005; B23P 11/02; B23P 19/02; B25B 1/00; B25B 1/50; B25B 7/00
See application file for complete search history.

(56) References Cited

U.S. PATENT DOCUMENTS

| 1,306,858 A | 6/1919 | Salter |
| 4,201,303 A | 5/1980 | Smith |

(Continued)

FOREIGN PATENT DOCUMENTS

JP    2003-3264383    9/2003

OTHER PUBLICATIONS

IPCOM000193807D, "VTM Insertion and Extraction System", Disclosed Anonymously, IP.com, Mar. 9, 2010, 6 pp.

(Continued)

*Primary Examiner* — Lee D Wilson
(74) *Attorney, Agent, or Firm* — Damion Joesephs

(57) ABSTRACT

A device comprises a rail configured to span and detachably couple to a housing. The device includes a plate that engages the housing and a mechanism securing the tool to the housing. The housing contains a printed circuit board configured with at least one row of slots, each slot configured with a retainer mechanism. A jaw assembly slides along the rail over more than one card positioned in the row of slots. The assembly includes a pair of inserts that perform either seating or extracting more than one card positioned in more than one slot. The device includes a lever for biasing the jaw assembly, where the inserts engage a selected one of more than one card positioned in more than one slot and the retainer mechanism for performing either simultaneously seating more than one card into or simultaneously extracting more than one card from more than slot.

4 Claims, 5 Drawing Sheets

(56) References Cited

U.S. PATENT DOCUMENTS

| | | |
|---|---|---|
| 4,620,756 A | 11/1986 | Gatti et al. |
| 5,171,003 A | 12/1992 | Kull |
| 6,056,567 A | 5/2000 | Schell |
| 6,135,435 A | 10/2000 | Schmitz |
| 6,356,094 B1 | 3/2002 | Tverdy et al. |
| 6,782,442 B2 | 8/2004 | Seto et al. |
| 6,935,628 B1 | 8/2005 | Conversa |
| 6,993,834 B2 | 2/2006 | Boyd et al. |
| 7,174,614 B2 | 2/2007 | Martz et al. |
| 7,254,040 B2 | 8/2007 | Barina et al. |
| 7,344,402 B2 | 3/2008 | Langgood et al. |
| 7,909,314 B2 | 3/2011 | Roesch et al. |
| 7,913,379 B2 | 3/2011 | Bodenweber et al. |
| 7,987,584 B2 | 8/2011 | Barna et al. |
| 8,544,831 B2 | 10/2013 | Klein et al. |
| 9,635,795 B2 * | 4/2017 | Casserly ............ H05K 13/0486 |
| 2001/0006270 A1 | 7/2001 | Baculy |
| 2004/0082210 A1 | 4/2004 | Wallace et al. |
| 2010/0327504 A1 | 12/2010 | Seidel |
| 2014/0111931 A1 * | 4/2014 | Casserly ................ G06F 1/185 |
| | | 361/679.32 |
| 2016/0029522 A1 * | 1/2016 | Casserly ................ G06F 1/185 |
| | | 29/426.2 |
| 2017/0123465 A1 | 5/2017 | Casserly et al. |

OTHER PUBLICATIONS

Bonvouloir, R. et al. "Circuit Card Load Gun", IPCOM000080513D, IBM, Dec. 1, 1973, 3 pp.

IPCOM000022486D: "Insertion/Extraction Mechanism, Mechanically Assisted, Low Profile, Spring-Loaded", Disclosed Anonymously, IP.com, Mar. 17, 2004, 3 pp.

Dual in-line memory modules insertion and ejection assembly has tool using which multi-DIMM sets are inserted onto motherboard, such that memory modules are ejected by lifting small handle on both ends, Research Disclosure (RD) database No. 491066, published in the Research Disclosure paper journal dated Mar. 10, 2005.

Non-final office action for U.S. Appl. No. 13/657,952 dated Apr. 14, 2016, 11 pp.

Notice of allowance for U.S. Appl. No. 13/657,952 dated Dec. 16, 2016, 8 pp.

Corrected notice of allowability for U.S. Appl. No. 13/657,952 dated Dec. 30, 2016, 4 pp.

Final office action for U.S. Appl. No. 13/657,952 dated Sep. 28, 2016, 10 pp.

* cited by examiner

MULTIPLE EXPANSION CARD INSERTION AND EXTRACTION TOOL

BACKGROUND

The present invention relates generally to inserting an expansion card into and extracting a expansion card from a printed circuit board and, in particular, to a tool for simultaneously inserting multiple expansion cards, such as memory modules, into and extracting multiple expansion cards from a printed circuit board.

Mainframe computers are powerful, high-performance computers used for large-scale computing purposes that require substantial availability and security. Mainframe computers are primarily used by corporate and governmental organizations for critical applications, bulk data processing, statistics, enterprise resource planning, and transaction processing. Historically, mainframe computers have functioned as "enterprise servers" although they were not referred to as enterprise servers or "servers" until the emergence of networked computing, such as the Internet.

Enterprise servers contain programs that collectively serve the needs of an enterprise rather than a single user, department, or specialized application. An enterprise server is both the computer's mainframe hardware and its main software that may include one or more operating systems running on the mainframe. Thus, enterprise servers provide security, fault tolerance, efficiency, and resource allocation to an enterprise.

Emerging enterprise servers, such as the IBM® zEnterprise™ System, may include a central processing complex (CPC), multiple blade computers, and multiple "processor books," all of which may be managed as a single entity by a resource manager. As can be appreciated the demand for computer memory in an enterprise server can be substantial. For example, an enterprise server may require up to three terabytes (3 TB) of available memory. To meet the memory demands of an enterprise server, the sever may is often configured with multiple processor books, commonly referred to in the art as "books".

A processor book, hereinafter book, includes a multi-chip module (MCM) that comprises one or more processors, data Input/Output (I/O) paths, and a significant amount of available memory. For example, a book may have up to 750 GB or more of memory available for the server.

Memory in the processor book may comprise a redundant array of independent memory (RAIM). RAIM is an emerging memory technology that similar in concept to known RAID technology for protecting against disk drive failure. In the case of memory, RAIM is capable of supporting several memory device chip-kills and entire memory channel failures. RAIM is more robust than parity checking and ECC memory technologies which cannot protect against many varieties of memory failures. RAIM utilizes several memory modules and striping algorithms to strip data across the memory modules in the array to protect against the failure of any particular module of the array and keeps the memory system operating continuously, thus improving fault tolerance of the enterprise server.

Each book may have between 30 and 32 memory slots mounted on a printed circuit board (PCB). Memory modules are inserted into available slots on the PCB to connect the memory to the PBC making the memory available for use by the server. Memory modules used in this application typically comprise "dual in-line memory module" or "DIMM" memory modules. DIMM memory modules comprise a series of dynamic random-access memory integrated circuits and have separate electrical contacts on each side of the module. The DIMM memory slots have latches on each end of the slot to prevent the DIMM from inadvertently detaching from the slot.

After manufacture, processor books and/or DIMMs are tested to ensure they operate properly. During the testing process of the DIMMs are manually inserted into and extracted from the memory slots a number of times. It takes a substantial amount of force, approximately 22 pounds of force, to insert a DIMM into a memory slot. It can be difficult for an operator to evenly exert the force needed to insert a DIMM into a memory slot. It can be substantially more difficult for an operator to repeatedly evenly exert the force needed to insert a DIMM into a memory slot over the course of a work day. Inserting, or attempting to insert, a DIMM into a memory slot with uneven force may cause damage to the DIMM, the memory slot, the memory slot latches, and other damage. For example, inserting a DIMM into a memory slot with more force on one end of the DIMM can damage to the DIMM and/or the latch, which may necessitate replacement of the DIMM with a new DIMM and repair of the latch and/or memory slot.

Over the course of a work day repeatedly exerting the force needed to insert DIMMs into a memory slots can cause operator fatigue and stress to the operator. This can results in ergonomic issues for an operator, such as sore and blistered fingers and thumbs and other potential injuries to the operator's hands.

DIMMs are often inserted into and then extracted from the memory slots up to three times during the during the testing process. Each book is configured with between 30 and 32 memory slots. As can be approached, it can be time consuming for an operator, to manually insert a DIMM into each memory slot and then extract the DIMM from each memory slot of the book, during the testing process.

BRIEF SUMMARY

In one embodiment, a device includes a rail configured to span more than one slot coupled to a printed circuit board and detachably coupled to a housing. The printed circuit board is retained in the housing and each slot is provided with a retainer mechanism for retaining a card in the slot. The device includes a jaw assembly that includes a pair of inserts configured to perform a selected one of seating and extracting a card positioned in at least one of the more than one slot. The jaw assembly is configured to slide along the rail and over the more than one slot. The device also includes a lever for biasing the jaw assembly in a second position where the pair of inserts perform a selected one of seating a card in at least one of the more than one slot and extracting a card from at least one of the more than one slot.

In another exemplary embodiment, a device that comprises a rail configured to span and detachably couple to a housing. The rail includes a mounting plate configured to engage the housing and a mechanism for securing the tool to the housing. The housing contains a printed circuit board configured with at least one row of slots comprising more than one slot, with each slot configured with a retainer mechanism for retaining a card in the slot. A jaw assembly is configured to slide along the rail over more than one card positioned in the row of slots when biased in a first position. The jaw assembly includes a pair of interchangeable inserts configured to perform a selected one of seating and extracting more than one card positioned in more than one slot. The device also includes a lever for biasing the jaw assembly in a second position, where the inserts engage a selected one of more than one card positioned in more than one slot and the retainer mechanism of more than one slot for performing a selected one of simultaneously seating more than one card into more than one slot and simultaneously extracting more than one card from more than slot.

In another embodiment a method that comprises providing a printed circuit board retained in a housing, the printed circuit board is configured with at least one row of slots, where each slot in the row of slots is configured with a retainer mechanism for retaining a card in the slot. The method continues with positioning cards in slots of the row of slots such that more than one card is positioned in more than one slot, and placing a device over one of the at least one row of slots such that the device is positioned over the at least one card positioned in at least one slot. In the embodiment, the device comprises a rail configured to span the housing and detachably couple thereto, a jaw assembly that is configured to slide along the rail and over the row of slots. The jaw assembly includes a pair of interchangeable inserts biased in a first position. The device also comprises a lever for biasing the interchangeable inserts in a second position. The method continues with aligning the interchangeable inserts to engage a selected one of the more than one card positioned in the more than one slot and retainer mechanism of more than one slot, and moving the lever to bias the interchangeable inserts in the second position, where the interchangeable inserts engage a selected one of the more than one card and retainer mechanism of more than one slot to perform a selected one of simultaneously seating more than one card into more than one slot and simultaneously extracting more than one card from more than one slot.

In a further embodiment, a system that comprises a housing containing a printed circuit board configured with at least one row of slots, where each slot is configured with a retainer mechanism for retaining a card in the slot. More than one card is positioned in more than one slot. The system also comprises a tool for performing a selected one of simultaneously seating the more than one card positioned in the more than one slot and simultaneously extracting the more than one card from the more than one slot. The tool comprises a rail configured to span the housing and detachably couple thereto, and a jaw assembly that is configured to slide along the rail and over the row of slots. The jaw assembly includes a pair of interchangeable inserts biased in a first position and a lever for biasing the interchangeable inserts in a second position. In the system, the tool positioned over a selected one of the at least one row of slots, such that the interchangeable inserts are aligned with a selected one of the more one card and retainer mechanism of more than one slot. The lever is then moved to bias the interchangeable inserts in the second position, where the interchangeable inserts engage a selected one of the more one card and retainer mechanism of more than one slot to perform the selected one of simultaneously seating more than one card into at more than one slot and simultaneously extracting more than one card from more than one slot.

DETAILED DESCRIPTION

Figure 1:
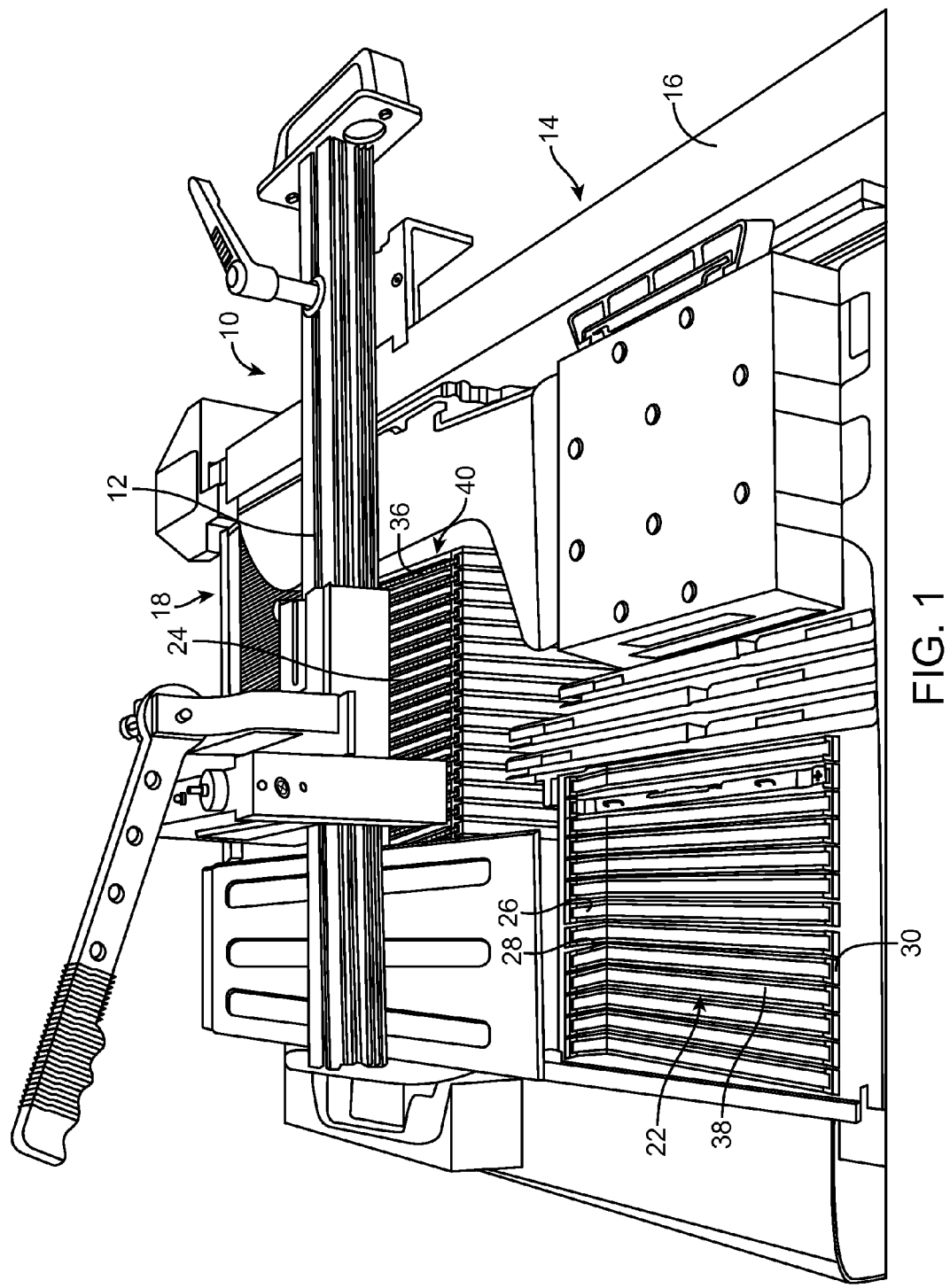
FIG. 1 is an perspective view showing an exemplary embodiment of a device for simultaneously inserting multiple cards into and extracting multiple cards from a printed circuit board coupled to a computer.

The following description is made for the purpose of illustrating the general principles of the invention and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

In one embodiment, a device includes a rail configured to span more than one slot coupled to a printed circuit board and detachably coupled to a housing. The printed circuit board is retained in the housing and each slot is provided with a retainer mechanism for retaining a card in the slot. The device includes a jaw assembly that includes a pair of inserts configured to perform a selected one of seating and extracting a card positioned in at least one of the more than one slot. The jaw assembly is configured to slide along the rail and over the more than one slot. The device also includes a lever for biasing the jaw assembly in a second position where the pair of inserts perform a selected one of seating a card in at least one of the more than one slot and extracting a card from at least one of the more than one slot.

In another exemplary embodiment, a device that comprises a rail configured to span and detachably couple to a housing. The rail includes a mounting plate configured to engage the housing and a mechanism for securing the tool to the housing. The housing contains a printed circuit board configured with at least one row of slots comprising more than one slot, with each slot configured with a retainer mechanism for retaining a card in the slot. A jaw assembly is configured to slide along the rail over more than one card positioned in the row of slots when biased in a first position. The jaw assembly includes a pair of interchangeable inserts configured to perform a selected one of seating and extracting more than one card positioned in more than one slot. The device also includes a lever for biasing the jaw assembly in a second position, where the inserts engage a selected one of more than one card positioned in more than one slot and the retainer mechanism of more than one slot for performing a selected one of simultaneously seating more than one card into more than one slot and simultaneously extracting more than one card from more than slot.

In another embodiment a method that comprises providing a printed circuit board retained in a housing, the printed circuit board is configured with at least one row of slots, where each slot in the row of slots is configured with a retainer mechanism for retaining a card in the slot. The method continues with positioning cards in slots of the row of slots such that more than one card is positioned in more than one slot, and placing a device over one of the at least one row of slots such that the device is positioned over the at least one card positioned in at least one slot. In the embodiment, the device comprises a rail configured to span the housing and detachably couple thereto, a jaw assembly that is configured to slide along the rail and over the row of slots. The jaw assembly includes a pair of interchangeable inserts biased in a first position. The device also comprises a lever for biasing the interchangeable inserts in a second position. The method continues with aligning the interchangeable inserts to engage a selected one of the more than one card positioned in the more than one slot and retainer mechanism of more than one slot, and moving the lever to bias the interchangeable inserts in the second position, where the interchangeable inserts engage a selected one of the more than one card and retainer mechanism of more than one slot to perform a selected one of simultaneously seating more than one card into more than one slot and simultaneously extracting more than one card from more than one slot.

In a further embodiment, a system that comprises a housing containing a printed circuit board configured with at least one row of slots, where each slot is configured with a retainer mechanism for retaining a card in the slot. More than one card is positioned in more than one slot. The system also comprises a tool for performing a selected one of simultaneously seating the more than one card positioned in the more than one slot and simultaneously extracting the more than one card from the more than one slot. The tool comprises a rail configured to span the housing and detachably couple thereto, and a jaw assembly that is configured to slide along the rail and over the row of slots. The jaw assembly includes a pair of interchangeable inserts biased in a first position and a lever for biasing the interchangeable inserts in a second position. In the system, the tool positioned over a selected one of the at least one row of slots, such that the interchangeable inserts are aligned with a selected one of the more one card and retainer mechanism of more than one slot. The lever is then moved to bias the interchangeable inserts in the second position, where the interchangeable inserts engage a selected one of the more one card and retainer mechanism of more than one slot to perform the selected one of simultaneously seating more than one card into at more than one slot and simultaneously extracting more than one card from more than one slot.

As will be appreciated by one skilled in the art, aspects of the invention may be embodied as an apparatus, system, or method. Aspects of the invention are described below with reference to flowchart illustrations and/or block diagrams of methods, and apparatus, including systems according to embodiments of the invention.

As illustrated in FIG. 1, there is shown generally at 10, an exemplary embodiment of a device, or tool, for simultaneously inserting multiple expansion cards into and extracting multiple expansion cards from a printed circuit board. In one embodiment, the tool 10 is particularly well suited for simultaneously inserting multiple memory modules into and extracting multiple memory modules from a printed circuit board.

Figure 2:
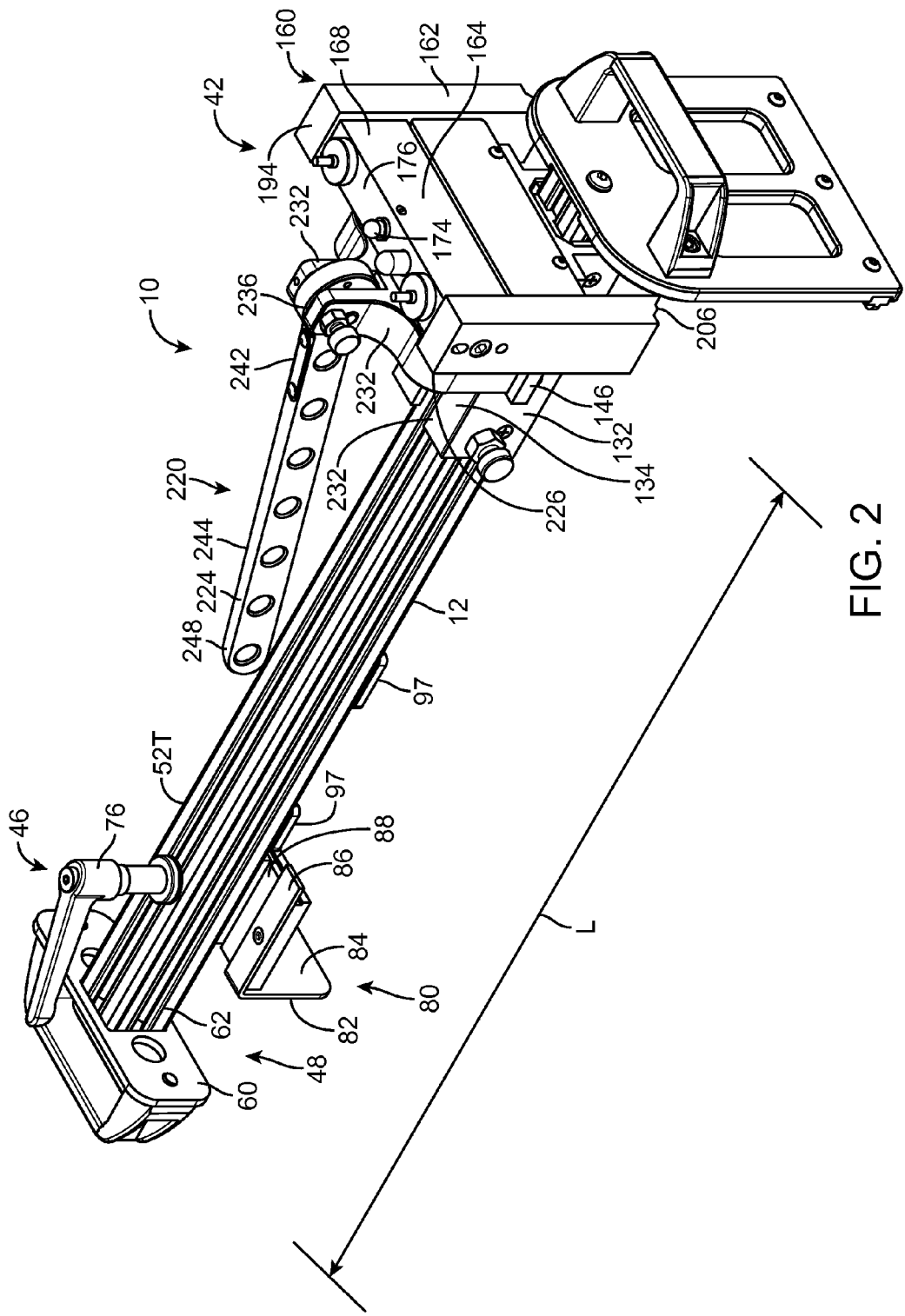
FIG. 2 illustrates a perspective view of an exemplary embodiment of a device for simultaneously inserting multiple cards into and extracting multiple cards from a printed circuit board.
Figure 3:
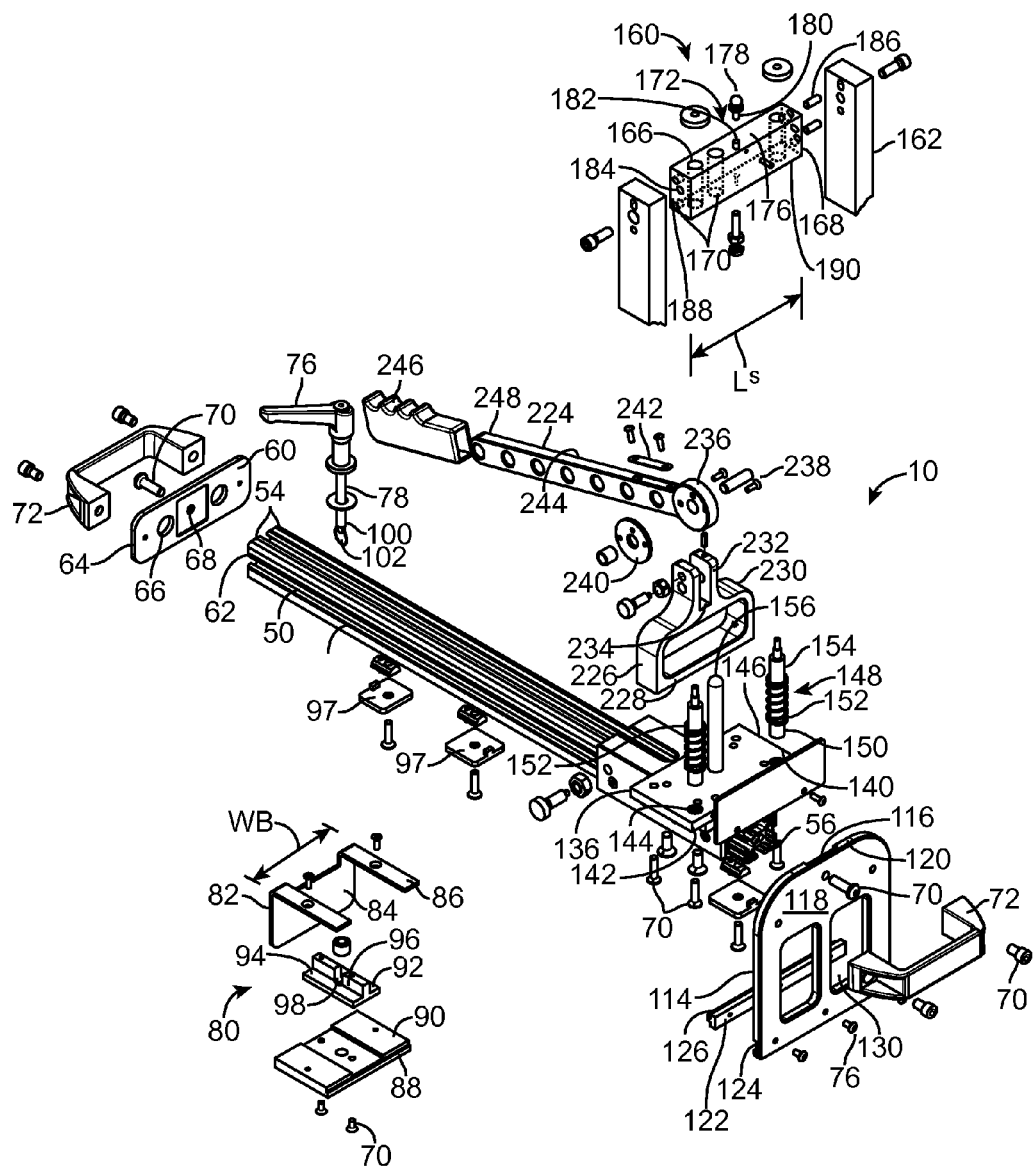
FIG. 3 illustrates an exploded, perspective view of an exemplary embodiment of a device for simultaneously inserting multiple cards into and extracting multiple cards from a printed circuit board.

Referring now to FIGS. 1-3, In an exemplary embodiment, the tool 10 includes a rail 12 configured to span and detachably couple to a housing 14. The housing 14 may comprise a chassis 16 of a computing device 18. The computing device 18, hereinafter computer 18 for ease of discussion only, may comprise a known rack-mount computer or processor book. For example, in one embodiment the computer 18 comprises a processor book for an enterprise server, such as the IBM® zEnterprise™ System. Such an enterprise server may comprise a plurality of processor books 18 that are managed as a single entity. As can be appreciated, the demand for computer memory in an enterprise server can be substantial and meet the memory demands of the enterprise server, each processor book, hereinafter book 18, may have up to 750 GB, or more, of memory available for the server.

For ease of discussion only, the computer 18 hereinafter is assumed to be a processor book 18, of an enterprise server. However, in alternative embodiments, the computer 18 may comprise a rack-mount server, server node, or desktop computer. Thus, the computer 18 may comprise any computer that includes a frame, enclosure, or chassis 16 that forms the enclosure that contains most of the components of the computer 18, and to which the tool 10 may detachably couple. In one exemplary embodiment, the chassis 16 may be constructed from steel, such as "SECC" (steel, electrogalvanized, cold-rolled, coil), aluminum, or other suitable metal alloys known in the art.

As illustrated in FIG. 1, in one exemplary embodiment, the computer 18 includes a motherboard 20 that provides the electrical connectivity by which other components of the computer 18 communicate, as is well known in the art. The motherboard 20 retains a central processing unit (CPU) and connectors (both not shown) for coupling peripheral devices, such as external data storage (not shown) to the computer 18. The motherboard 20 further includes slots 22 for connecting other components to the computer 18. It is to be understood that the slots 22 may comprise any slot known in the art for connecting peripheral devices or memory to the computer 18 via the motherboard 20. In some embodiments, the slots 22 may comprise expansion slots, such as such as PCI, PCI-X, PCI Express, and AGP Pro which are used for connecting peripheral cards such as video display cards, sound cards, Network cards, TV tuner cards, among numerous other peripheral cards to the computer 18. In other embodiments, the slots 22 may comprise any of several known memory slots for connecting memory modules, such as SIMM, DIMM, and other known memory modules to the computer 18. It is to be understood that most frequently the slots 22 provided on the motherboard 20 comprise both expansion slots and memory slots. Thus, in this description, slots 22 may refer to either expansion slots or memory slots, or both.

In some embodiments where the slots 22 comprise memory module slots for retaining a memory module 24, each end of the slot 22 may be configured with a rotatable "retainer", or latch 26 to prevent the memory module 24 from moving about in or inadvertently detaching from the slot 22. For example, each end of the memory module slot 22 includes a latch 26 coupled to the slot 22. The latch 26 includes an arm 28 with an inwardly projecting catch 30. The memory module 24 is coupled to the slot 22 by pressing the module 24 into the slot 22. As the module 24 is pressed into the slot 22, a bottom edge of the memory module 24 contacts a bottom side 38 of each latch 26, which causes the arm 28 of each latch 26 to rotate toward the side of the memory module 24 until the catch 30 retains the memory module 24 in the slot 22.

Similarly, to detach the memory module 24 from the slot 22, the memory module 24 is pressed slightly downward into the slot 22 until the arm 28 of each latch 26 rotates away the sides of the memory module 24 and the catches 30 are withdrawn from a top 36 of the memory module 24, to release the module 24 from the slot 22.

In some embodiments, the memory modules 24 comprise known dual in-line memory modules, known in the art as DIMM modules, or more accurately as "DIMMs." It is to be understood that embodiments of the invention may be used with any suitable expansion or memory slot 22 and their compatible expansion cards or memory modules 24, as known in the art.

In one exemplary embodiment, the computer 18 may have one or more rows 40 of memory slots 22. Each row 40 of memory slots 22 may have from about four slots 22 up to between 16 to 18 slots 22.

Referring again to FIGS. 1-4, in one exemplary embodiment, the tool 10 includes a jaw assembly 42 slidably coupled to the rail 12, toward a front end 44 thereof, and a handle assembly 46 slidably coupled to the rail 12, toward a back end 48 of the rail 12.

In one embodiment, the rail 12 comprises an extrusion of sufficient length L to span the chassis 16 of the computer 18. The rail 12 may be formed with different lengths L depending upon the width of chassis 16 to which the tool 10 will detachably couple. In some preferred embodiments, the rail 12 is formed with a plurality of longitudinal T-slot channels 50 centrally positioned in each side 52 thereof, and a center 56 that extends the length L of the rail 12. Additionally, the rail 12 is configured with four corners 54 that define a generally rectangular shape of the rail 12. In one embodiment, the center 56 of the rail 12 may have an elongated slot 58 formed therein. The elongated slot 58 may be up to about 4.0 inches in length and is configured to receive the handle assembly 46, to allow the handle assembly 46 to be moved along the length L of the rail 12.

In one preferred embodiment, the rail 12 is constructed from a suitable lightweight and rigid alloy, such as aluminum or an aluminum alloy such as 61OS-TS aluminum alloy. The rectangular shape of the rail 12 and rigidity of aluminum may inhibit torsional forces to the rail 12 when the tool 10 is in use, thus allowing the jaw assembly 42 to slide freely along the rail 12, during use of the tool 10.

Figure 4:
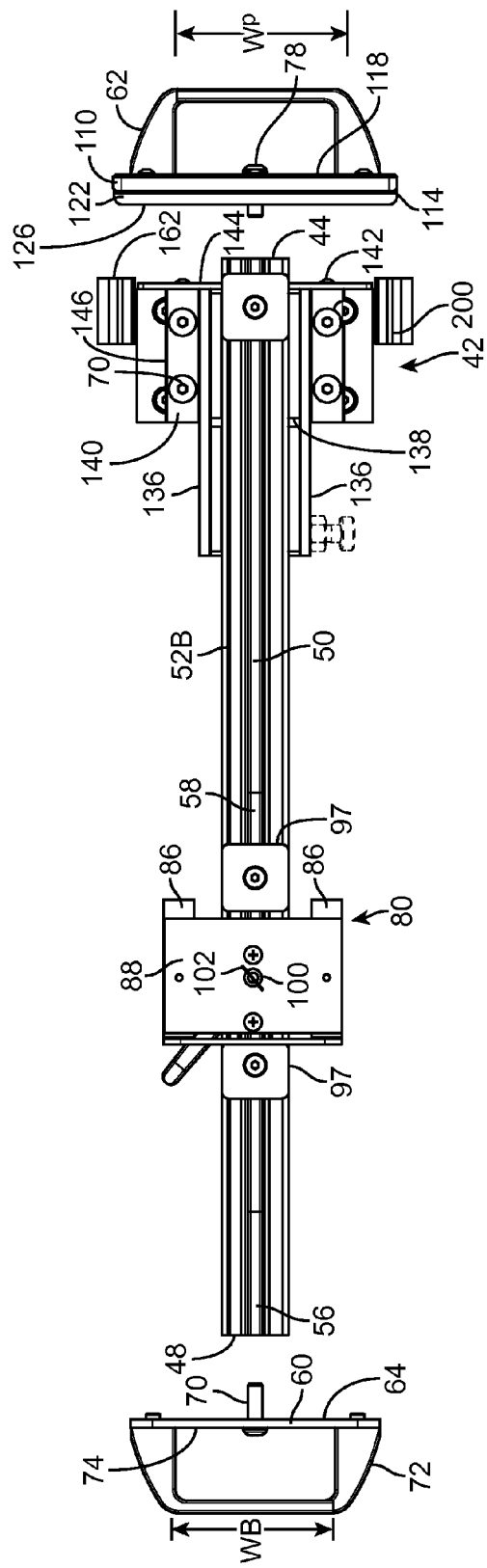
FIG. 4 is a bottom plan view of an exemplary embodiment of a device for simultaneously inserting multiple cards into and extracting multiple cards from a printed circuit board.
Figure 5:
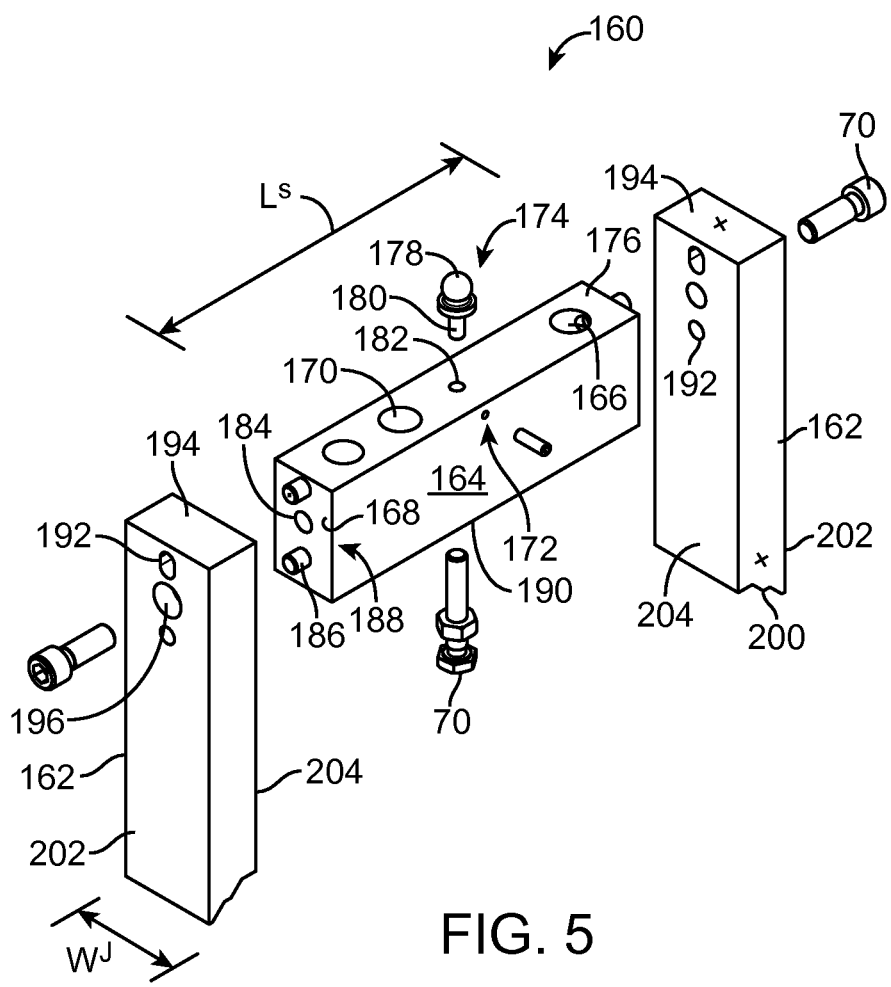
FIG. 5 is an exploded, perspective view of an exemplary embodiment of a jaw assembly of a device for simultaneously inserting multiple cards into and extracting multiple cards from a printed circuit board.

As illustrated in FIGS. 2-4, in one embodiment, an end plate 60 is affixed to the back end 48 of the rail 12. The end plate 60 is affixed to the rail's back end 48 using known methods, such as by bolting the end plate 60 to the back end 48 of the rail 12. In one preferred embodiment, an inner surface 64 of the end plate 60 is configured with a recess 66 configured to receive the back end 48 of the rail 12. The recess 66 is provided with a central aperture 68 for receiving a suitable fastener 70 that may comprise a bolt or screw. The fastener 70 is disposed through the central aperture 68 and threaded into the rail's center 56 for attaching the end plate 60 to the rail 12. The fastener 70 is threaded into the rail's center 56, until the end plate's recess 66 is tight against the rail's back end 48. In one preferred embodiment, the end plate 60 may be constructed from a suitable lightweight and rigid alloy, such as aluminum or an aluminum alloy.

A grab handle 72 may be attached to an outer surface 74 of the end plate 60 using known methods. For example, the grab handle 72 may be attached to the end plate's outer surface 74 using known fasteners 70, that may comprise a bolts or screws. The grab handle 72 may be provided to facilitate moving the tool 10 to different positions on the chassis 16 or for moving the tool 10 from one computer 18 to the next.

In some embodiments, the tool's handle assembly 46 is provided to detachably couple and end of the tool to the chassis 16 of a computer 18 to inhibit the tool 10 from moving relative to the chassis 16 while the tool 10 is in use.

In one embodiment, the handle assembly 46 includes a turn handle 76 that extends above a top side 52T of the rail 12. The turn handle 76 may comprise any suitable and commercially available turn handle 76 that includes a shaft 78. In a preferred embodiment, the shaft 78 is configured to extend through the elongated slot 58 in the rail 12.

The handle assembly 46 also includes a bracket assembly 80. The bracket assembly 80 includes an L-shaped rear bracket 82. The rear bracket 82 includes a wall 84 and a pair of inwardly projecting arms 86 that extend generally parallel to the length L of the rail 12, when the bracket 82 is coupled to the rail 12. In a preferred embodiment, the rear bracket 82 is formed with a width $W^B$ that is wider than the rail 12, such that the arms 86 extend on either side 52 of the rail 12. In some embodiments, the rear bracket 82 may be constructed from a suitable lightweight and rigid alloy, such as aluminum or an aluminum alloy.

A generally planer bracket clamp 88 is provided to engage the rear bracket 82 for inhibiting relative movement between the handle assembly 46 and rail 12, when the handle assembly 46 is secured to the rail 12. The bracket clamp 88 includes a pair of pads 90 on each end thereof configured to engage the inwardly projecting arms 86 of the rear bracket 82. An elongated T-shaped key 92 is configured to be interposed between the pads 90 and affixed to the bracket clamp 88. The elongated T-shaped key 92 has a flat bottom portion 94 that extends across the clamp 88, between the pads 90, and is affixed to the clamp 88. The elongated key 92 may be attached to the clamp 88 using known fasteners 70, such as screws. In some embodiments, the elongated key 92 may be constructed from a suitable Polyoxymethylene (POM) or other suitable thermoplastic material that is sold under trade names such as Delrin® and Celcon®. In alternative embodiments, the elongated key 92 may be constructed from a suitable lightweight and rigid alloy, such as aluminum or an aluminum alloy.

The elongated key 92 further includes a ridge 96 with an aperture 98 formed therein. The aperture 98 is dimensioned to receive an end 100 of the turn handle's shaft 78 for coupling the turn handle 76 to the bracket assembly 80. In one embodiment, a spring 102 is coupled to the shaft's end 100. The spring 102 is snap-fit into the aperture 92, for securing the turn handle 76 to the bracket assembly 80. In another embodiment, not shown, the shaft's end 100 and aperture 98 may each be threaded for threading the shaft 78 into the aperture 98, to secure the turn handle 76 to the bracket assembly 80. In some embodiments, the elongated key's ridge 96 is formed complementary to the rail's T-slot channels 50. In one exemplary embodiment, the ridge 96 extends into T-slot channel 50 on a bottom side 52B of the rail 12, when the bracket assembly 80 is against or adjacent to the bottom side 52B.

Generally rectangular spacers 97 may be coupled to the bottom side 52B of the rail 12, with a pair of the rectangular spacers 97 coupled to the rail's bottom side 52B and on either side of the bracket assembly 80. In some embodiments, the rectangular spacers 97 are provided to inhibit the bottom side 52B of the rail 12 from contacting either the computer 18 or chassis 16, for example when the tool 10 is coupled to the chassis 16. The rectangular spacers 97 may also inhibit the rail's bottom side 52B from contacting either the computer 18 or chassis 16, when the tool 10 is detached from the chassis 16 and repositioned over a different row 40 of memory modules 24 or slots 22.

In use, the turn handle's shaft 78 is disposed through the elongated slot 58 in the rail 12 and coupled to the bracket assembly 80. The turn handle 76 is then rotated clockwise for drawing the bracket assembly 80 against the rail's bottom side 52B. The turn handle 76 is rotated clockwise until the elongated key's bottom portion 94 and the clamp's pads 90 are tight against the bottom side 52B, to inhibit any inadvertent movement between the handle assembly 46 and rail 12. The turn handle 76 may be rotated counterclockwise until the elongated key's bottom portion 94 and the clamp's pads 90 disengage the rail's bottom side 52B, thus enabling the handle assembly 46 to slide forward and backward in the elongated slot 58 and along the length L of the rail 12.

Referring still to FIGS. 2-4, in some embodiments, a front plate 110 is affixed to the front end 44 of the rail 12 using known methods. In one preferred embodiment, an inner surface 114 of the front plate 110 is configured with a recess 116 configured to receive the front end 44 of the rail 12. The recess 116 is provided with a central aperture 118 for receiving a suitable fastener 70 that may comprise a bolt or screw. The fastener 70 is disposed through the central aperture 118 and threaded into the rail's center 56 for attaching the front plate 110 to the rail 12. The fastener 70 is threaded into the rail's center 56, until the end plate's recess 116 is tight against the rail's front end 44. In one preferred embodiment, the front plate 110 may be constructed from a suitable lightweight and rigid alloy, such as aluminum or an aluminum alloy.

In some embodiments, a grab handle 72 may be affixed an outer surface 134 of the plate 110 to facilitate moving the tool 10 to different positions on the computer's chassis 16 for moving the tool 10 from one computer 18 to the next. The grab handle 72 is affixed to the front plate 110, towards a top edge 120 thereof, using known methods, such as by bolting or screwing the handle 72 to the outer surface 134 of the plate 110.

In some embodiments, an elongated T-shaped rod 122 may be affixed to the inner surface 114 of the front plate 110. If preferred embodiments, the rod 122 is dimensioned to reside in a channel 124 formed in the front plate's inner surface 114 and is affixed to the plate 110 using known fasteners 70, in one embodiment. The elongated rod 122 has a ridge 126 that extends its length and that is configured to be placed in a groove 128 in the computer's chassis 16. The ridge 126 is positioned in the groove 128 to inhibit movement between the front plate 110, and thus the tool 10, and chassis 16 during use of the tool 10. Optionally, one or more openings 130 may be formed in the front plate 110. The openings 130 are formed in the front plate 110, to remove material from the plate 110 and reduce its weight and the overall weight of the tool 10.

As illustrated in FIG. 2, the jaw assembly 42 includes a slide block 132 for slidably coupling the jaw assembly 42 to the rail 12. In some embodiments, the slide block 132 comprises a mounting surface 134 that extends over the top side 52T of the rail 12 and side walls 136 that extend downwardly and adjacent the sides 50 of the rail 12. In one embodiment, at least one of the side walls 136 of the slide block 132 is configured with a bearing 138 that resides in the elongated slot 58 of at least one side 52 of the rail 12. In one preferred embodiment, the side walls 136 are configured with a linear bearing 138 that resides in the elongated slot 58 of each side 52 of the rail 12, to facilitate sliding the jaw assembly 42 along the rail 12.

In one embodiment, a substantially flat mounting plate 140 is attached to the mounting surface 134 of the slide block 132. The mounting plate 140 may be attached to the mounting surface 134 using suitable fasteners 70. In a preferred embodiment, the mounting plate 140 is generally rectangular and has a width $W^P$, greater than the width of the rail's top side 52T. The mounting plate 140 is affixed to the slide block's mounting surface 134 such that a front side 142 of the mounting plate 140 extends generally parallel to a front edge 144 of the slide block 132.

In some embodiments, a plurality of apertures may be formed in the mounting plate 140. In one embodiment, an aperture 144 is located adjacent to the front side 142 and each side edge 146 of the mounting plate 140. The apertures 144 are provided for coupling spring shafts 148 to the mounting plate 140. For example, in some embodiments, the apertures 140 may be threaded and an end 150 of each spring shaft 148 is threaded similarly, for threading the shafts 148 into the apertures 144, to secure the spring shafts 148 to the mounting plate 140. Alternatively, the end 150 of each spring shaft 148 may have a threaded hole (not shown) configured to receive a similarly threaded fastener 70 that is dimensioned to be disposed through each aperture 144. The fastener 70 is disposed though each aperture 144 and threaded into the hole in the end 150 of each spring shaft 148 for fastening the shafts 148 to the mounting plate 140. Each spring shaft 148 has a helical spring 152 that extends about its periphery 154, discussed hereinafter.

Additionally, a guide shaft 156 may be affixed to the mounting plate 140 and interposed between the spring shafts 148. The guide shaft 156 may be fastened to the mounting plate 140 using suitable fasteners 70, as previously discussed. In some embodiments, the slide block 132, mounting plate 140, spring shafts 148, helical springs 152, and guide shaft 156 may be constructed from suitable lightweight and rigid alloys. These alloys include, but are not limited to, steel, aluminum, aluminum alloy, and other suitable materials known in the art.

Referring to FIG. 2-5, the jaw assembly 42 includes a jaws subassembly 160. The jaws subassembly 160 includes a pair of interchangeable jaw inserts 162 detachably coupled to a spacer bar 164. In some embodiments, the spacer bar 164 has a length $L^S$ approximately equal to the length of a memory module 24, or any other expansion card (not shown) to be inserted or removed using the tool 10. A pair of openings 166 located adjacent to each end 168 of the spacer bar 164 extend vertically through the spacer bar 164. In one embodiment, the openings 166 are dimensioned to receive the spring shafts 148. The spacer bar 164 additionally includes an aperture 170 that extends vertically through and proximate to a center 172 of the bar 164. In a preferred embodiment, the aperture 170 is dimensioned to receive the guide shaft 156. When the jaws subassembly 160 is coupled to the jaw assembly 42, such that the spring shafts 148 and guide shaft 156 reside in the openings 166 and aperture 170 of the spacer bar 164, rotation of the spacer bar 164 relative to the rail 12 while the tool is in use is inhibited. The guide shaft 156 and spring shafts 148 may be secured to the spacer bar 164 using suitable known fasteners 70, such as screws. In some embodiments, the interchangeable jaw inserts 162 and spacer bar 164 may be constructed from a suitable Polyoxymethylene (POM) or other suitable thermoplastic material, such as those sold under trade names such as Delrin® and Celcon®. In alternative embodiments, the elongated key 92 may be constructed from a suitable lightweight and rigid alloy, such as aluminum or an aluminum alloy.

In one embodiment, a lever ball 174 may be affixed to a top edge 176 of the spacer bar 164. In one preferred embodiment, the lever ball 174 may comprise a commercially available tooling ball comprising a ball head 178 made integral with a shank 180. The shank 180 is dimensioned to reside in a cavity 182 formed in the center 172 of spacer bar 164. In some embodiments, the shank 180 may be threaded for threading the lever ball 174 into the cavity 182, if also threaded, to attach the lever ball 174 to the spacer 164. In one preferred embodiment, the lever ball's shank 180 is press fit into the cavity 182, as is well known in the art, to fasten the lever ball 174 to the spacer bar 164.

In one embodiment, an interchangeable jaw insert 162 is detachably coupled to each end 168 of the spacer bar 164. The jaw inserts 162 are configured to easily attach to, and detach from, the ends 168 of the spacer bar 164, to facilitate orienting the inserts 162 for inserting or extracting memory modules 24, or other expansion cards, from the slots 22. To facilitate coupling the jaw inserts 162 to the spacer bar's ends 168, and to align the jaw inserts 162 with the spacer bar 164, each end 168 is configured with a threaded bore 184 and at least one dowel 186. In one preferred embodiment, the threaded bore 184 in each end 168 is located in a center 188 of the end 168 and a dowel 186 is interposed between the center 188 of the end 168 and the top 176 and a second dowel 186 is interposed between the center 188 and a bottom edge 190 of the end 168.

Similarly, in a preferred embodiment, each jaw insert 162 is configured with a pair of holes 192 adjacent a top edge 194 thereof and an opening 196 interposed between the holes 192, all of which are aligned along a vertical axis V of the insert 162. Preferably, the holes 192 are dimensioned to receive the dowels 186 to couple the inserts 162 to the ends 168 of the spacer bar 164. Further, the opening 196 in each jaw insert 162 is dimensioned to receive a fastener 70, such as a threaded bolt or screw, that is disposed through the opening 196 and threaded into the spacer bar's threaded bore 184, for quickly securing the jaw inserts 162 to the spacer bar 164.

Referring to FIGS. 1-5, each jaw insert 162 has a contoured bottom 200. In one embodiment, the jaw insert's contoured bottom 200 is configured to engage the rotatable latch 26 on each end of the slots 22 on the motherboard 20. The contoured bottom 200 of the jaw insert 162 may comprise any of numerous different shapes, depending on certain determining factors. These determining factors can include shape of the inwardly projecting catch 30 of the latch 26, shape of the arm 28, location of adjacent slots 22, and other known and obvious determining factors. In preferred embodiments, the generally non-regular arcuate shape of the contoured bottom 200 allows the jaw inserts 162 to perform both inserting a memory module 24 into and extracting a memory module 24 from a slot 22.

For example, the jaw inserts 162 have an insert side 202 and an extract side 204. When the jaw inserts 162 are secured to the ends 168 of the spacer bar 164, with the insert side 202 of each jaw insert 162 against the spacer bar's ends 168, the jaw inserts 162 are in an "insert" position. Similarly, when the jaw inserts 162 are secured to the ends 168 of the spacer bar 164, with the extract side 204 of each jaw insert 162 against the spacer bar's ends 168, the jaw inserts 162 are in an "extract" position.

In some embodiments, the jaw inserts 162 may be configured in different predetermined widths $W^J$, to simultaneously engage more than one rotatable latch 26 on adjacent slots 22. In one preferred embodiment, the jaw inserts 162 are configured with a width $W^J$, that allows the jaw inserts 162 to simultaneously engage the rotatable latch 26 on about four adjacent slots 22. In such an embodiment, the shape of the jaw insert's contoured bottom 200 allows the jaw inserts 162 to perform both inserting more than one card into more than one slot 22 or extracting more than one card from more than one slot 22.

As illustrated in FIGS. 2-3, in some embodiments, the tool 10 includes a lever assembly, shown generally at 220, for moving the jaw assembly 42 into a selected one of the insert position and extract position, depending on the orientation of the jaw inserts 162. In one embodiment, the lever assembly 220 includes an elongated lever bar 224 rotatably coupled to a bridge 226. In one preferred embodiment, the bridge 226 comprises a lower wall 228 attached to the jaw assembly's mounting plate 140 and an upper wall 230. Preferably, the lower wall 228 is attached to the mounting plate 140 adjacent to the spring shafts 148 and guide shaft 156. Preferably, the lower wall 228 extends the width $W^P$ of the mounting plate 140 and is fastened thereto using fasteners 70. The bridge's upper wall 230 is configured with a pair of upwardly projecting flanges 232 that are spatially positioned about a midpoint 234 thereof.

In some embodiments, the elongated lever bar 224 has an annular end 236 positioned between the upwardly projecting flanges 232 and rotatably coupled thereto. Optionally, one or more limit pins 238 may be disposed though and coupled to the annular end 236 of the lever bar 224 to inhibit excessive and inadvertent rotation of the lever bar 224 about the bridge 226 to prevent damage to the tool 10 or harm from coming to a user. A washer 240, or similar device, may be interposed between the lever bar's annular end 236 and flanges 232 to allow the lever bar 224 to rotate, while being secured to the flanges 232, as is known in the art.

Optionally a shim 242 may be affixed to an underside 244 of the lever bar 224. The shim 242 may be provided to inhibit excessive wear to the lever bar 224 during use. Optionally, a tactile and pliant polymeric grip 246 may be fit on to an end 248 of the lever bar 224. The optional polymeric grip 246 may be provided to provide comfort to the user during use of the tool 10.

Referring now to the Figures, memory modules 24 to be inserted into a row 40 slots 22 in on a motherboard 20 of a computer 18 are first positioned in the slots 22 and readied for insertion into the slots 22 by hand, as is known. It is first determined that the jaw inserts 162 are in the insert position, where the insert side 202 of each jaw insert 162 is against the spacer bar's ends 168. The tool 10 is then positioned over the row 40 of memory modules 24, with the rail 12 spanning the computer's chassis 16 and extending over the memory modules 24. The elongated T-shaped rod 122, affixed to the inner surface 114 of the front plate 110, is then placed in the groove 128 in the computer's chassis 16. The ridge 126 is positioned in the groove 128 to inhibit movement between the front plate 110, and thus the tool 10, and chassis 16 during use of the tool 10.

The turn handle 76 of the handle assembly 46 is rotated counterclockwise to loosen the handle assembly 46, to allow the handle assembly 46 to slide along the rail 12. The handle assembly 46 is slid along the rail 12 until the inwardly projecting arms 86 and bracket clamp 88 engage the chassis 16. The turn handle 76 is then rotated clockwise to tighten the bracket assembly 80 against the chassis 16 and rail 12, to detachably couple the tool to the chassis 16.

The lever assembly 220, and thus, the jaw assembly 42 is then slid along the rail 12 until the jaw inserts 162 are aligned with the latches 26 of slots 22 where the memory modules 24 are to be inserted. The helical springs 152 bias the jaws subassembly 160 upwardly and away from the latches 26 to prevent the inserts 162 from inadvertently contacting the latches 26 and for ease of use of the tool 10.

The lever bar 224 is rotated clockwise until the shim 242 contacts the ball head 178 of the lever ball 174 of the spacer bar 164. The lever bar 224 rotated further clockwise, compressing the helical springs 152, thus pressing the spacer bar 164 and inserts 162 downwardly. The spacer bar 164 and inserts 162 are pressed downwardly until the contoured bottom 200 of the inserts 162 engage the latches 26 on each side of each slot 22, causing the inwardly projecting catch 30 of each latch 26 to engage the notch 32 in each side edge 34 of the memory module 24, thus inserting the memory module 24 into the slot 22. The process is repeated until all memory modules 24 are inserted in their slots 22.

If it is desired to extract memory modules 24 from a row 40 slots 22 in on a motherboard 20 of a computer 18, it is first determined that the jaw inserts 162 are in the extract position, where the extract side 204 of each jaw insert 162 is against the spacer bar's ends 168. The tool 10 is then positioned over the row 40 of memory modules 24, with the rail 12 spanning the computer's chassis 16 and extending over the memory modules 24. The elongated T-shaped rod 122, affixed to the inner surface 114 of the front plate 110, is then placed in the groove 128 in the computer's chassis 16. The ridge 126 is positioned in the groove 128 to inhibit movement between the front plate 110, and thus the tool 10, and chassis 16 during use of the tool 10.

The turn handle 76 of the handle assembly 46 is rotated counterclockwise to loosen the handle assembly 46, to allow the handle assembly 46 to slide along the rail 12. The handle assembly 46 is slid along the rail 12 until the inwardly projecting arms 86 and bracket clamp 88 engage the chassis 16. The turn handle 76 is then rotated clockwise to tighten the bracket assembly 80 against the chassis 16 and rail 12, to detachably couple the tool to the chassis 16.

The lever assembly 220, and thus, the jaw assembly 42 is then slid along the rail 12 until the jaw inserts 162 are aligned with the latches 26 of slots 22 where the memory modules 24 are to be extracted. The helical springs 152 bias the jaws subassembly 160 upwardly and away from the latches 26 to prevent the inserts 162 from inadvertently contacting the latches 26 and for ease of use of the tool 10. The lever bar 224 is rotated clockwise until the shim 242 contacts the ball head 178 of the lever ball 174 of the spacer bar 164. The lever bar 224 rotated further clockwise, compressing the helical springs 152, thus pressing the spacer bar 164 and inserts 162 downwardly. The spacer bar 164 and inserts 162 are pressed downwardly until the contoured bottom 200 of the inserts 162 engage the latches 26 on each side of each slot 22, causing the inwardly projecting catch 30 of each latch 26 to disengage the notch 32 in each side edge 34 of the memory module 24, thus detaching and extracting the memory module 24 from the slot 22. The process is repeated until all memory modules 24 are extracted from their slots 22. The memory modules 24 may then be removed from the row 40 of slots 22 by hand, as is known in the art.

Those skilled in the art will appreciate that various adaptations and modifications can be configured without departing from the scope and spirit of the embodiments described herein. Therefore, it is to be understood that, within the scope of the appended claims, the embodiments of the invention may be practiced other than as specifically described herein.

What is claimed is:
1. A method comprising:
  providing a printed circuit board retained in a housing, the printed circuit board configured with at least one row of slots, each slot in the row of slots configured with a retainer mechanism for retaining a card in the slot;
  positioning cards in slots of the row of slots such that more than one card is positioned in more than one slot;
  placing a device over one of the at least one row of slots such that the device is positioned over the at least one card positioned in at least one slot, the device comprising:
    a rail configured to span the housing and detachably couple thereto;
    a jaw assembly configured to slide along the rail and over the row of slots, the jaw assembly including a pair of interchangeable inserts biased in a first position; and
    a lever for biasing the interchangeable inserts in a second position;
  aligning the interchangeable inserts to engage a selected one of the more than one card positioned in the more than one slot and retainer mechanism of more than one slot; and
  moving the lever to bias the interchangeable inserts in the second position where the interchangeable inserts engage a selected one of the more than one card and retainer mechanism of more than one slot to perform a selected one of simultaneously seating more than one card into more than one slot and simultaneously extracting more than one card from more than one slot.

2. The method of claim 1, wherein each of the more than one card comprises one of a memory module and an expansion card, and wherein the retainer mechanism comprises a locking clip configured for retaining one of a memory module and an expansion card in the slot.

3. The method of claim 1, wherein the jaw assembly further comprises:
  a cross member biased in a first position, the cross member slidably coupled to the rail and extending transversely thereto, the cross member is dimensioned with a length, the length of the cross member determined by the length of at least one of a memory module, an expansion card, and the length of a slot; and
  each insert of the pair of interchangeable inserts interchangeably coupled to an end of the cross member, each insert formed with an end configured for engaging at least one of the memory module, expansion card, and locking clip when the jaw assembly is biased in the second position.

4. The method of claim 1, further comprising:
  the device comprising:
    a mounting plate attached to a front end of the rail, the mounting plate including an alignment member dimensioned to be received in notches along a first edge of the housing; and
    the mechanism detachably coupling the device to the housing, the mechanism comprising:
      a mounting bracket attached to a rear end of the rail, the mounting bracket configured to engage a second edge and a side of the housing for detachably coupling the device to the housing; and
  an engagement mechanism rotatably coupled to the mounting bracket and configured to slide along a length of the rail for sliding the mounting bracket along a length of the rail, wherein rotating the engagement mechanism in a first direction draws the mounting bracket towards the rail to engage the rail with the second edge and side of the housing to inhibit movement between the housing and rail, and rotating the engagement mechanism in a second direction moves the mounting bracket away from the rail to disengage the rail from the second edge and side of the housing to release the device from the housing.

* * * * *